(12) United States Patent
Lee et al.

(10) Patent No.: US 7,582,496 B2
(45) Date of Patent: Sep. 1, 2009

(54) LED PACKAGE USING SI SUBSTRATE AND FABRICATING METHOD THEREOF

(75) Inventors: Sung Jun Lee, Seoul (KR); Woong Lin Hwang, Kyungki-do (KR); Sang Hyun Choi, Seoul (KR); Chang Hyun Lim, Daegu (KR); Ho Joon Park, Seoul (KR); Seog Moon Choi, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 367 days.

(21) Appl. No.: 11/312,412

(22) Filed: Dec. 21, 2005

(65) Prior Publication Data
US 2006/0220036 A1 Oct. 5, 2006

(30) Foreign Application Priority Data
Mar. 30, 2005 (KR) .............. 10-2005-0026515

(51) Int. Cl.
H01L 21/00 (2006.01)
H01L 33/00 (2006.01)
(52) U.S. Cl. .................................. 438/26; 257/98
(58) Field of Classification Search .............. 438/26, 438/122, 29–32; 257/707, 81, 98, E33.001–E33.077
See application file for complete search history.

(56) References Cited
U.S. PATENT DOCUMENTS
6,531,328 B1* 3/2003 Chen ........................ 438/26
7,067,406 B2* 6/2006 Liang et al. ............... 438/584
7,235,430 B2* 6/2007 Romano et al. ........... 438/122
2005/0077616 A1* 4/2005 Ng et al. ................... 257/707
2006/0124953 A1* 6/2006 Negley et al. .............. 257/99

FOREIGN PATENT DOCUMENTS
JP 2003-243718 8/2003
JP 2004-311791 11/2004
JP 2005-019609 1/2005

OTHER PUBLICATIONS

Japanese Office Action issued in Japanese Patent Application No. 2005-368411, dated Dec. 9, 2008.

* cited by examiner

Primary Examiner—Calvin Lee
(74) Attorney, Agent, or Firm—McDermott Will & Emery LLP

(57) ABSTRACT

There are provided an LED package using a Si substrate and a fabricating method of the LED package. In the LED package, a supporting structure includes a Si substrate and an insulating layer formed on top and bottom surfaces of the Si substrate, and the supporting structure defines at least one groove in a bottom surface by partially removing the Si substrate and the insulating layer. A plurality of upper electrodes is formed on a top surface of the supporting structure. At least one LED is mounted on the top surface of the supporting structure, and the LED includes both terminals electrically connected to the upper electrodes. A metal filler is filled in the groove defined in the bottom surface of the supporting structure.

18 Claims, 4 Drawing Sheets

(a)

(b)

(c)

LED PACKAGE USING SI SUBSTRATE AND FABRICATING METHOD THEREOF

RELATED APPLICATION

The present application is based on, and claims priority from, Korean Application Number 2005-26515, filed Mar. 30, 2005, the disclosure of which is hereby incorporated by reference herein in its entirety.

BACKGROUND OF THE INVENTION

1. Field of the Invention

The present invention relates to an LED package using a Si substrate and a fabricating method of the LED package, and more particularly, to an LED package using a Si substrate in which a metallic heat dissipating unit is provided in a side opposite to a side on which an LED is mounted to effectively dissipate heat generated from the LED to the outside for preventing degradation of the LED and increasing the lifespan of the LED, and a fabricating method of the LED package.

2. Description of the Related Art

Light emitting diode (LED) is a diode that emits light using energy generated when injected electrons and holes are recombined. Examples of the LED are red LEDs using GaAsP or the like, and green LEDs using GaP or the like. In addition, nitride semiconductors using nitride (e.g., GaN) are widely used as photoelectric materials and essential materials of electronic devices because of their good physical and chemical properties. Nitride semiconductor LEDs are drawing attractions. The nitride semiconductor LEDs generate light in range of red, blue, and ultraviolet. With the breakthrough in brightness of the nitride semiconductor LEDs due to the technical development, the nitride semiconductor LEDs are applied to many fields, such as full-color electronic display boards and lighting devices. Various kinds of packages for mounting the LEDs are fabricated, depending on applications of the LED.

LED packages can be fabricated using various materials. Specifically, LED packages have been recently developed which use a silicon (Si) substrate having good processability and relatively good heat conductivity. An LED package using a Si substrate is disclosed in U.S. Pat. No. 6,531,328. The conventional LED package is illustrated in FIG. 1.

Referring to FIG. 1, in the conventional LED package 10, an LED receiving portion is defined by forming a groove in a predetermined region of a Si substrate with flat top and bottom surfaces, and insulating layers 12 are formed in the top and bottom surfaces of the processed Si substrate 11. Then, a conductive via hole (h) is formed to pass through the LED receiving portion and the bottom surface of the Si substrate. An upper electrode 14 is formed to be electrically connected to an LED 16 on the LED receiving portion, and a reflective layer 13 is formed on an inclined face of the groove and the top surface of the Si substrate 11. Depending on the mounting methods of the LED 16, the reflective layer 13 may be used as the upper electrode. In this case, the reflective layer 13 has to be formed of conductive metal with high reflectivity. In FIG. 1, the reflective layer 13 is used as the upper electrode connected to one electrode terminal (a negative terminal or a positive terminal) of the LED 16, and the other terminal of the LED 16 is connected to a separate upper electrode 14 through a wire. Then, a lower electrode 15 is formed to be electrically connected to the reflective layer 13 and the upper electrode 14 through the conductive via hole (h). The groove for the mounting of the LED is filled with a resin material or the like. Through the above processes, the LED package is completed.

Meanwhile, for applications (e.g., lighting devices) requiring high brightness, the LED consumes more power and thus a large amount of heat is generated from the LED. If the generated heat is not effectively dissipated, characteristics of the LED may be degraded or lifespan of the LED may be reduced.

In consideration of heat generated from the high-brightness, high-power LED, when the mounted LED is a high-power LED generating a large amount of heat, the heat dissipation is achieved by adjusting the thickness of the Si substrate, because the conventional LED package 10 of FIG. 1 does not have a separate heat dissipating unit. However, this method has a limitation in improving the heat dissipating efficiency. Therefore, even the use of Si substrates with good heat conductivity cannot solve the thermal degradation of the LED characteristics and the reduction in the lifespan of the LED.

SUMMARY OF THE INVENTION

Accordingly, the present invention is directed to an LED package using a Si substrate and a fabricating method of the LED package that substantially obviates one or more problems due to limitations and disadvantages of the related art.

An object of the present invention is to provide an LED package using a Si substrate that is constructed to effectively dissipate heat generated from a high-brightness, high-power LED by forming a heat dissipating unit on one side of the Si substrate opposite to the other side on which the LED is mounted.

Another object of the present invention is to provide a fabricating method of the LED package using the Si substrate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an LED package using a Si substrate includes: a supporting structure including a Si substrate and an insulating layer formed on top and bottom surfaces of the Si substrate, the supporting structure defining at least one groove in a bottom surface by partially removing the Si substrate and the insulating layer; a plurality of upper electrodes formed on a top surface of the supporting structure; at least one LED mounted on the top surface of the supporting structure, the LED including both terminals electrically connected to the upper electrodes; and a metal filler filled in the groove defined in the bottom surface of the supporting structure.

The LED package may further include: a plurality of conductive via holes defined through the top and bottom surfaces of the supporting structure and electrically connected with the upper electrodes, respectively; and a plurality of lower electrodes formed on the bottom surface of the supporting structure in electric connection with the conductive via holes.

The LED package may further include a reflecting structure formed around the LED on the top surface of the supporting structure, the reflecting structure having a sloped surface for reflecting light emitted from the LED in an upward direction. The LED package may further include a lens unit attached to the reflecting structure above the LED for controlling direction of the light emitted from the LED.

The groove may be defined in an upward direction toward the top surface of the supporting structure in a hole pattern with a plurality of holes that do not penetrate the Si substrate, or the groove may be defined in an upward direction toward the top surface of the supporting structure in a slit pattern with a plurality of slits that do not penetrate the Si substrate.

Further, the groove may be formed in various patterns and shapes. The metal filler may be formed of one metal selected from the group consisting of Cu, Ni, and Au.

The insulating layer may be formed of SiO2.

According to another aspect of the present invention, there is provided a fabricating method of an LED package using a Si substrate, the fabricating method including: preparing a Si substrate; forming a supporting structure by forming an insulating layer on top and bottom surfaces of the Si substrate; defining a groove in a bottom surface of the supporting structure by partially removing the insulating layer and the Si substrate; filling a metal filler in the groove defined in the bottom surface of the supporting structure; forming a plurality of upper electrodes on a top surface of the supporting structure; and mounting at least one LED on the top surface of the supporting structure in electrical connection with the upper electrodes.

The forming of the supporting structure may be performed by forming a SiO2 insulating layer on the top and bottom surfaces of the Si substrate by heat treating the Si substrate at an oxygen atmosphere.

The fabricating method may further include defining a via hole through the top and bottom surfaces of the Si substrate prior to the forming of the supporting structure. In this case, the fabricating method further includes forming a conductive via hole by filling the via hole with a conductive material prior to the forming of the plurality of upper electrodes, and the forming of the upper electrodes may be performed such that the conductive via holes and the upper electrodes are electrically connected, respectively. The fabricating method may further include forming a lower electrode on the bottom surface of the supporting structure in electrical connection with the conductive via hole.

The forming of the groove may be performed by forming a hole pattern with a plurality of holes that are defined in the bottom surface of the supporting structure in a direction toward the top surface of the supporting structure and do not penetrate the Si substrate, or the forming of the groove may be performed by forming a slit pattern with a plurality of slits that are defined in the bottom surface of the supporting structure in a direction toward the top surface of the supporting structure and do not penetrate the Si substrate.

The fabricating method may further include forming a reflecting structure around the LED on the top surface of the supporting structure, the reflecting structure having a sloped surface for reflecting light emitted from the LED in an upward direction, and the fabricating method may further include disposing a lens unit by attaching the lens unit to the reflecting structure above the LED, for controlling direction of the light emitted from the LED.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
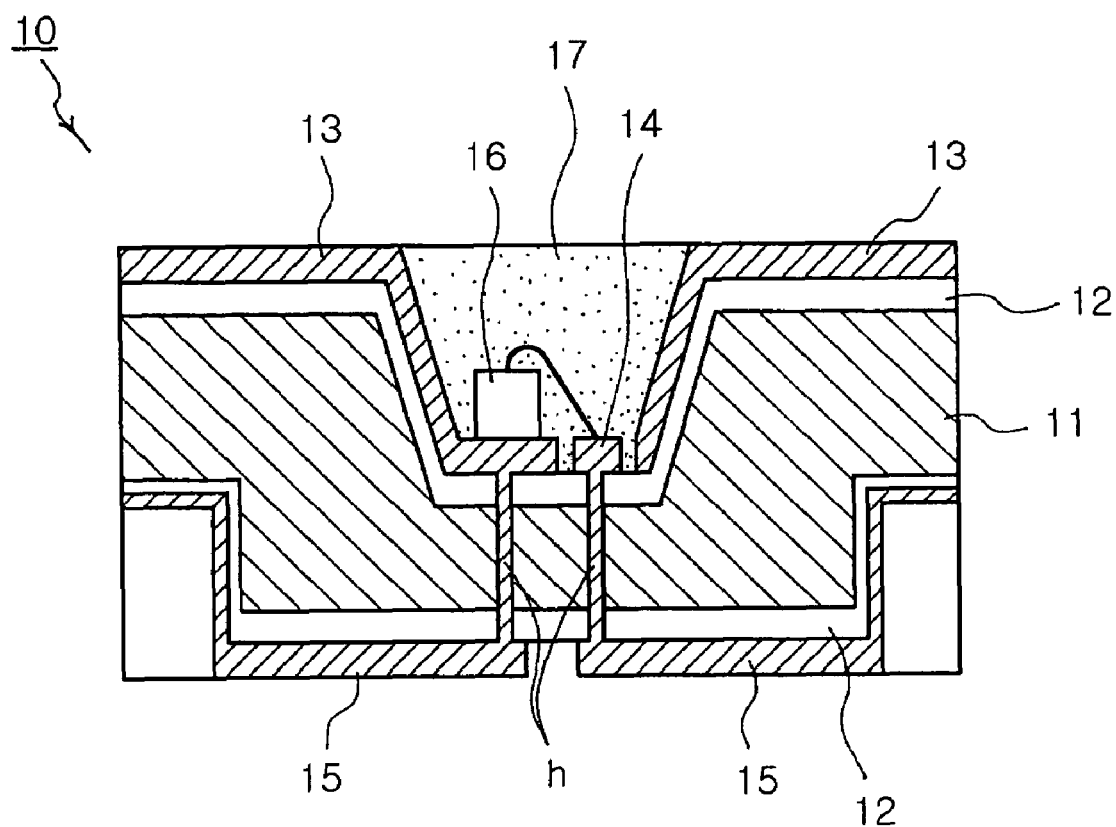
FIG. 1 is a sectional view of a conventional LED package using a Si substrate.

Reference will now be made in detail to the preferred embodiments of the present invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity, and like reference numerals denote like elements.

Figure 2:
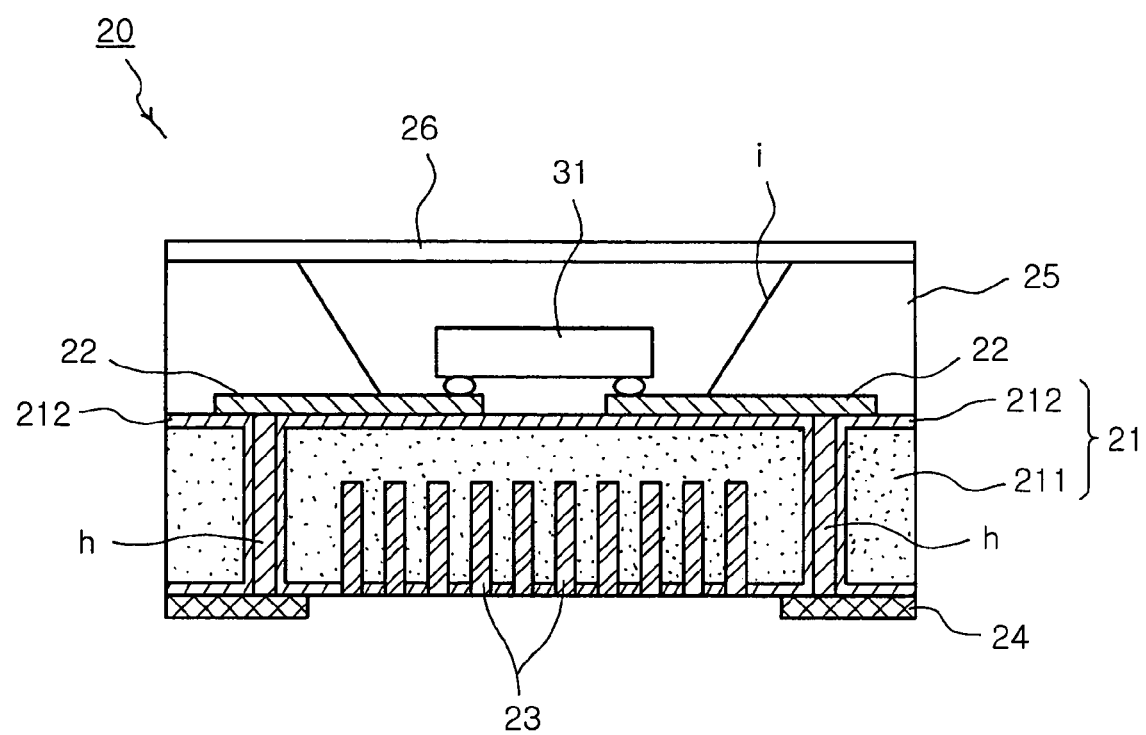
FIG. 2 is a sectional view of an LED package according to an embodiment of the present invention.

FIG. 2 is a sectional view of an LED package according to an embodiment of the present invention. Referring to FIG. 2, an LED package 20 using a Si substrate according to an embodiment of the present invention includes a Si substrate 211, insulating layers 212 formed on top and bottom surfaces of the Si substrate 211, a supporting structure 21 having at least one groove formed in a bottom of the supporting structure 21 by partially removing the Si substrate 211 and the insulating layers 212, a plurality of upper electrodes 22 formed on a top of the supporting structure 21, at least one LED 31 mounted on the supporting structure 21 with both terminals of the LED 31 being in electrical connection with the upper electrodes 22, and a metal filler 23 filling the groove formed in the bottom of the supporting structure 21.

The LED package 20 using the Si substrate according to the embodiment of the present invention may further include a plurality of conductive via holes (h) defined through top and bottom surfaces of the supporting structure 21 and electrically connected to the respective upper electrodes 22, a plurality of lower electrodes 24 formed on the bottom of the supporting structure 21 and electrically connected with the conductive via holes (h), a reflecting structure 25 formed around the LED 31 on the top surface of the supporting structure 21 and having a sloped surface (i) reflecting light emitted from the LED 31 upwardly, and a lens unit 26 attached to the reflecting structure 25 above the LED 31 to control the direction of the light emitted from the LED 31.

The supporting structure 21 includes the Si substrate 211 and the insulating layers 212 formed on the top and bottom surfaces of the Si substrate 211.

The Si substrate 211 is a commercially available substrate used for fabricating semiconductor devices or the like. The Si substrate 211 is easily fabricated and has a relatively high thermal conductivity. Since the Si substrate 211 is electrically conductive, an insulating layer must be formed on the Si substrate 211 before a conductive pattern for electric connections is formed in order to use the Si substrate for mounting electrical devices thereon.

The insulating layers 212 are formed to block the electrical conductivity of the Si substrate 211. Though the insulating layers 212 can be formed on the Si substrate 211, SiO₂ insulating layers may be formed on the Si substrate 211 by heat treating the Si substrate 211 at an oxygen atmosphere. If the Si substrate 211 is used in this way, insulating layers can be formed on the substrate 211 through a simple heat treatment.

The supporting structure 21 includes the at least one groove in the bottom thereof. Preferably, the groove is formed in the bottom of the supporting structure 21 under the LED 31 which is mounted on the top of the supporting structure 21. Thus, heat generated from the LED 31 can be easily dissipated from the bottom of the supporting structure 21 through the metal filler 23. Preferably, the metal filler 23 is formed of one metal selected from the group consisting of Cu, Ni, and Au that have a high thermal conductivity.

Figure 3:
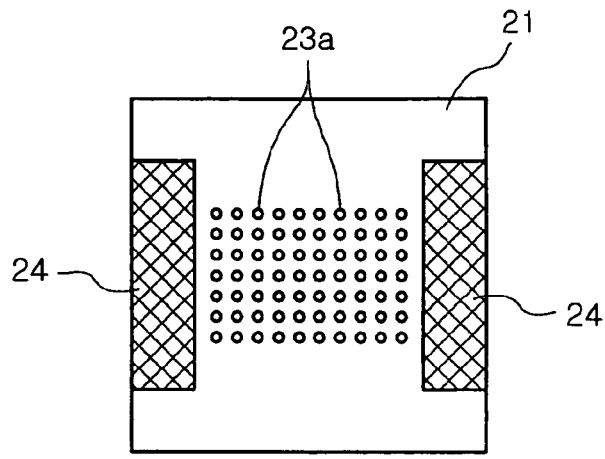
FIGS. 3A to 3C are plan views of heat dissipating units according to embodiments of the present invention.
Figure 3:
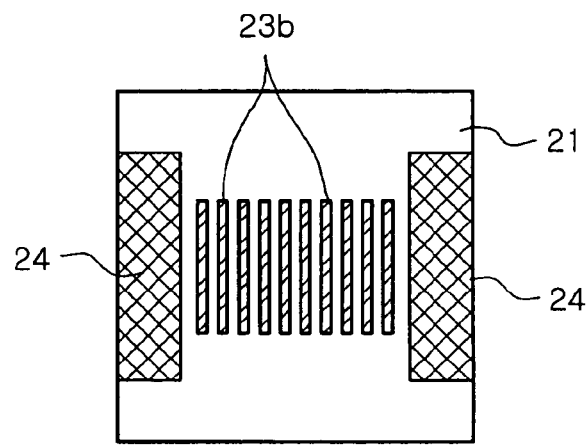
Figure 3:
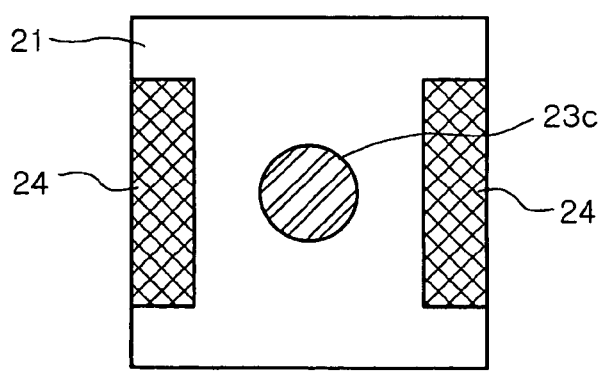

The groove filled with the metal filler 23 can be formed in various shapes. FIGS. 3A to 3C show various shapes of the groove. FIGS. 3A to 3C are bottom plan views of LED packages according to embodiments of the present invention. First, as shown in FIG. 3A, the groove can be formed in a hole pattern 23a with a plurality of holes that are defined in the bottom of the supporting structure 21 toward the top of the supporting structure but do not penetrate a Si substrate. If the groove penetrates the Si substrate, an electrical short circuit can occur between a metal filler filled in the groove and a wire pattern formed on the top of the substrate. Therefore, it is preferable that the groove do not penetrate the Si substrate.

Further, as shown in FIG. 3B, the groove can be formed in a slit pattern 23b with a plurality of slits that are defined in the bottom of the supporting structure 21 toward the top of the supporting structure 21 but do not penetrate a Si substrate.

Furthermore, as shown in FIG. 3C, the groove can be formed in a single large hemispheric structure 23c.

In this way, grooves having various shapes can be applied to the present invention. However, if a metal filler is filled in a single large groove as shown in FIG. 3C, the metal filler can be separated from the Si substrate because of the weight of the metal filler or other reasons when adhesive characteristic between the metal filler and the Si substrate is considered. Therefore, it is preferable that the groove have a structure having a small sectional area as shown in FIGS. 3A and 3B (the hole pattern or slit pattern) for filling the metal filler therein.

The supporting structure 21 includes the plurality of upper electrodes 22 on the top thereof. The upper electrodes 22 are respectively connected with an anode terminal and a cathode thermal of the LED 31 for supplying a current from an outside power source to the LED 31. Although one LED 31 is shown in FIG. 2, a plurality of LEDs 31 can be mounted on one package if necessary. Therefore, the number of upper electrodes 22 may be adjusted according to the number of LEDs 31. For electrical connection between the upper electrical electrodes 22 and a power source outside the LED package, the upper electrodes 22 may be electrically connected with the conductive via holes (h) formed under the upper electrodes 22, and the conductive via holes (h) may be electrically connected to the lower electrodes 24 formed on the bottom of the supporting structure 21. In this specification, the term "via hole" is used to denote an empty hole passing through the upper and lower portions of the supporting structure 21, and the term "conductive via hole" is used to denote the via hole filled with a conductive material. The lower electrodes 24 receives a current from an outside power source, and the current is supplied to the LED 31 through the conductive via holes (h) and the upper electrodes 22.

Although FIG. 2 shows that the upper electrodes are electrically connected to the lower electrodes through the conductive via holes, the present invention is not limited to the illustrated structure. The upper electrodes can be extended to the bottom of the supporting structure along a side of the supporting structure.

Further, FIG. 2 shows that the LED is flip-chip bonded to the upper electrodes using bumps. However, the present invention is not limited to the illustrated structure. The LED can be mounted on the supporting structure using various well-known methods.

The LED package 20 of this embodiment additionally includes the reflecting structure 25 with the sloped surface (i) formed around the LED 31 on the top of the supporting structure 21 to reflect light emitted from the LED 31 in an upward direction. The reflecting structure 25 may be formed of a material such as Si and ceramic, and it may enclose the LED 31. A side of the reflecting structure 25 located to a side of the LEDs 31 may be sloped toward the LED 31 and coated with a material having a very high reflectivity. Therefore, light emitted from the LED 31 toward the sloped side can be reflected upwardly, increasing the optical efficiency of the LED package.

Further, the lens unit 26 may be formed above the LED 31 to control the direction of light emitted from the LED 31. The lens unit 26 may include a glass plate and micro-optics (not shown) formed on the glass plate and having a micro lens structure. The micro-optics reflects or refracts light emitted from the LED 31 such that light can be outputted from the LED package in a desired direction. Further, the lens unit 26 is attached to a top of the reflecting structure 25 to protect the LED 31 from outside environments.

Meanwhile, the present invention provides a fabricating method of an LED package using a Si substrate.

Figure 4:
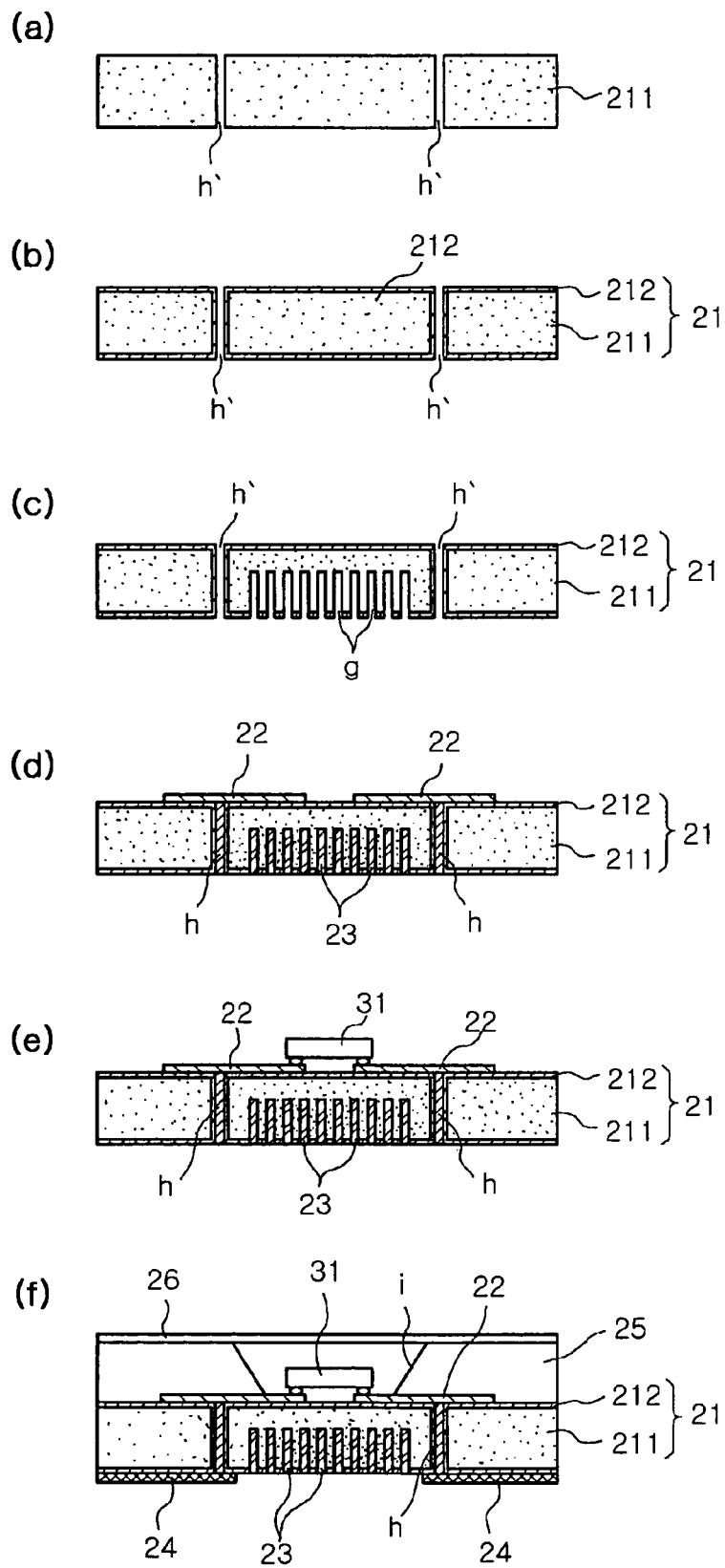
FIGS. 4A to 4F are section views showing a fabricating method of an LED package according to the present invention.

A fabricating method of an LED package according to an embodiment of the present invention is shown in FIGS. 4A to 4F. Referring to FIG. 4A, a Si substrate 211 forming a supporting structure is prepared. In case where the LED package is configured in that upper electrodes and lower electrodes are electrically connected through via holes, it is preferable that via holes (h') be defined through top and bottom surfaces of the Si substrate 211 before forming insulating layers. Since the Si substrate 211 is electrically conductive, conductive via holes to which a current is to be applied can be electrically insulated from the conductive Si substrate 211 in this way.

Referring to FIG. 4B, the Si substrate formed with the via holes (h') is heat treated in an oxygen atmosphere to form $SiO_2$ insulating layers on top and bottom surfaces of the Si substrate 211 and inner surfaces of the via holes (h'), thereby forming a supporting structure 21. Instead of the heat treatment, the insulating layers can be formed using other methods. However, to form the insulating layer even in the small via holes (h'), it is preferable that the insulating layers be formed in the form of thermal oxide layer (the $SiO_2$ insulating layer) through the heat treatment.

Referring to FIG. 4C, grooves (g) are formed by partially removing the insulating layer and the Si substrate 211 from a bottom of the supporting structure 21. The grooves (g) can be formed in various shapes and patterns using mechanical drilling or chemical etching. AS an example, the grooves (g) can be formed in a hole pattern with a plurality of holes that are defined in the bottom of the supporting structure 21 toward the top of the supporting structure but do not penetrate the Si substrate 211. As another example, the grooves (g) can be formed in a slit pattern with a plurality of slits that are defined in the bottom of the supporting structure 21 toward the top of the supporting structure 21 but do not penetrate the Si substrate 211.

Referring to FIG. 4D, a conductive material is filled in the via holes (h', see FIG. 4C) to form conductive via holes (h), and upper electrodes 22 are formed on the top of the supporting structure 21 in electric connection with the via holes (h). Further, metal fillers are filled in the grooves formed in the bottom of the supporting structure 21.

The conductive via holes (h) and the upper electrodes 22 may be simultaneously formed through a single process using the same metal. The metal fillers may be formed of one metal selected from the group consisting of Cu, Ni, and Au.

Referring to FIG. 4E, at least one LED (31) is mounted on the top of the supporting structure 21 in electric connection with the upper electrodes 22. The LED 31 may be mounted through various methods well known to those of skill in the art. As an example of mounting the LED 31, FIG. 4E shows that the LED 31 is electrically connected with the upper electrodes 22, and at the same time, the LED 31 is mounted on the supporting structure 21 through a flip-chip method using bumps. Besides that, the LED 31 can be directly bonded to the top of the supporting structure 21 through soldering, and both terminals of the LED 31 can be respectively connected to the upper electrodes 22 through wire bonding, or one terminal of the LED 31 can be directly bonded to one upper electrode 22 and the other terminal can be electrically connected to the other upper electrode 22 through wire bonding.

Referring to FIG. 4F, a reflecting structure 25 with a sloped surface (i) is formed around the LED 31 on the top of the supporting structure 21 for reflecting light emitted from the LED 31 upwardly. Next, a lens unit 26 is attached to the reflecting structure 25 above the LED 31 for controlling the direction of light emitted from the LED 31, and lower electrodes 24 are formed on a bottom of the supporting structure 21 in electric connection with the conductive via holes, thereby completing the fabricating method the LED package using the Si substrate according to an embodiment of the present invention.

To verify improvement of the heat dissipation effect of the present invention, experiments are performed as follows: a supporting structure with a bottom filled with a metal filler according the present invention and a supporting structure without a metal filler are prepared; the same LEDs are mounted on the prepared supporting structures, respectively; and the maximum temperature and thermal resistance are measured on the respective supporting structure after the LEDs are turned on for the same time.

First, a $SiO_2$ insulating layer is formed on a Si substrate with a thickness of about 300 μm, and an LED is attached on the insulating layer through soldering to a thickness of about 2 μm. Then, the LED is operated. In this experiment, the maximum temperature and thermal resistance of the supporting structure were 32.61° C., and 7.61° C./W.

Next, a $SiO_2$ insulating layer is formed on a Si substrate with a thickness of about 300 μm, grooves with a 100-μm diameter and a 250-μm length are defined in a bottom of the Si substrate at 100-μm intervals in a matrix configuration, and metal fillers are filled in the grooves. Next, an LED is attached on a top (a top of the insulating layer) of the supporting structure filled with the metal fillers through soldering to a thickness of about 2 μm. Then, the LED is operated. In this experiment, the maximum temperature and thermal resistance of the supporting structure were 31.44° C., and 6.44° C./W.

Since heat dissipation effect is improved by filling the bottom of the supporting structure with the metal fillers, the maximum temperature and the thermal resistance are decreased together in the experimental results. Therefore, according to the present invention, heat generated from the LED can be dissipated to the outside more effectively.

As described above, according to the present invention, at least one groove is defined in the bottom of the Si substrate on which the LED is mounted, and the groove is filled with a metal filler having a high thermal conductivity, such that heat generated from the LED can be dissipated to the outside more effectively, thereby preventing thermal degradation of the LED characteristic and improving the lifespan and reliability of the LED.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A fabricating method of an LED package using a Si substrate, comprising:

preparing a Si substrate;

forming a supporting structure by forming an insulating layer on top and bottom surfaces of the Si substrate;

defining a groove in a bottom surface of the supporting structure by partially removing the insulating layer and the Si substrate;

filling a metal filler in the groove defined in the bottom surface of the supporting structure;

forming a plurality of upper electrodes on a top surface of the supporting structure; and mounting at least one LED on the top surface of the supporting structure in electrical connection with the upper electrodes.

2. The fabricating method of claim 1, wherein the forming of the supporting structure is performed by forming a $SiO_2$ insulating layer on the top and bottom surfaces of the Si substrate by heat treating the Si substrate at an oxygen atmosphere.

3. The fabricating method of claim 1, further comprising defining a via hole through the top and bottom surfaces of the Si substrate prior to the forming of the supporting structure.

4. The fabricating method of claim 3, further comprising forming a conductive via hole by filling the via hole with a conductive material prior to the forming of the plurality of upper electrodes, wherein the forming of the upper electrodes is performed such that the conductive via holes and the upper electrodes are electrically connected, respectively.

5. The fabricating method of claim 4, further comprising forming a lower electrode on the bottom surface of the supporting structure in electrical connection with the conductive via hole.

6. The fabricating method of claim 1, wherein the forming of the groove is performed by forming a hole pattern with a plurality of holes that are defined in the bottom surface of the supporting structure in a direction toward the top surface of the supporting structure and do not extend completely through the Si substrate.

7. The fabricating method of claim 1, wherein the forming of the groove is performed by forming a slit pattern with a plurality of slits that are defined in the bottom surface of the supporting structure in a direction toward the top surface of the supporting structure and do not extend completely through the Si substrate.

8. The fabricating method of claim 1, further comprising forming a reflecting structure around the LED on the top surface of the supporting structure, the reflecting structure having a sloped surface for reflecting light emitted from the LED in an upward direction.

9. The fabricating method of claim 8, further comprising disposing a lens unit by attaching the lens unit to the reflecting structure above the LED, for controlling direction of the light emitted from the LED.

10. The fabricating method of claim 1, wherein the metal filler is formed of one metal selected from the group consisting of Cu, Ni, and Au.

11. An LED package using a Si substrate, comprising:

a supporting structure including a Si substrate and an insulating layer formed on top and bottom surfaces of the Si substrate, the supporting structure defining at least one groove in a bottom surface by partially removing the Si substrate and the insulating layer;

a plurality of upper electrodes formed on a top surface of the supporting structure;

at least one LED mounted on the top surface of the supporting structure, the LED including both terminals electrically connected to the upper electrodes; and a metal filler filled in the groove defined in the bottom surface of the supporting structure.

12. The LED package of claim 11, further comprising:
- a plurality of conductive via holes defined through the top and bottom surfaces of the supporting structure and electrically connected with the upper electrodes, respectively; and
- a plurality of lower electrodes formed on the bottom surface of the supporting structure in electric connection with the conductive via holes.

13. The LED package of claim 11, further comprising a reflecting structure formed around the LED on the top surface of the supporting structure, the reflecting structure having a sloped surface for reflecting light emitted from the LED in an upward direction.

14. The LED package of claim 13, further comprising a lens unit attached to the reflecting structure above the LED for controlling direction of the light emitted from the LED.

15. The LED package of claim 11, wherein the groove is defined in an upward direction toward the top surface of the supporting structure in a hole pattern with a plurality of holes that do not extend completely through the Si substrate.

16. The LED package of claim 11, wherein the groove is defined in an upward direction toward the top surface of the supporting structure in a slit pattern with a plurality of slits that do not extend completely through the Si substrate.

17. The LED package of claim 11, wherein the metal filler is formed of one metal selected from the group consisting of Cu, Ni, and Au.

18. The LED package of claim 11, wherein the insulating layer is formed of $SiO_2$.

* * * * *